US009385262B2

(12) United States Patent
Suzuki

(10) Patent No.: US 9,385,262 B2
(45) Date of Patent: Jul. 5, 2016

(54) METHOD OF MANUFACTURING SEMICONDUCTOR DEVICE AND SEMICONDUCTOR DEVICE

(71) Applicant: CANON KABUSHIKI KAISHA, Tokyo (JP)

(72) Inventor: Yukinobu Suzuki, Koza-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/468,166

(22) Filed: Aug. 25, 2014

(65) Prior Publication Data

US 2015/0061060 A1 Mar. 5, 2015

(30) Foreign Application Priority Data

Aug. 28, 2013 (JP) ................................ 2013-176253

(51) Int. Cl.
| | |
|---|---|
| *H01L 27/30* | (2006.01) |
| *H01L 31/18* | (2006.01) |
| *H01L 23/522* | (2006.01) |
| *H01L 23/528* | (2006.01) |
| *H01L 27/146* | (2006.01) |

(52) U.S. Cl.
CPC ............ *H01L 31/18* (2013.01); *H01L 23/5226* (2013.01); *H01L 23/5283* (2013.01); *H01L 27/14636* (2013.01); *H01L 27/14689* (2013.01); *H01L 27/14643* (2013.01); *H01L 2924/0002* (2013.01)

(58) Field of Classification Search
CPC .................. H01L 27/14603; H01L 27/14623; H01L 27/14685; H01L 27/76838; H01L 27/76843
USPC ........... 257/215, 233, 291, 292; 438/636, 736
See application file for complete search history.

(56) References Cited

U.S. PATENT DOCUMENTS

| | | | | | |
|---|---|---|---|---|---|
| 5,449,947 | A | * | 9/1995 | Chen | H01L 23/5252 257/50 |
| 5,668,411 | A | * | 9/1997 | Hong | H01L 21/76841 257/751 |
| 5,730,834 | A | * | 3/1998 | Gabriel | H01L 21/02071 438/627 |
| 5,858,879 | A | * | 1/1999 | Chao | H01L 21/32139 134/1.2 |
| 6,080,657 | A | * | 6/2000 | Liu | H01L 21/76838 257/E21.582 |
| 6,083,830 | A | * | 7/2000 | Yamadai | H01L 21/76838 257/763 |
| 6,159,847 | A | * | 12/2000 | Havemann | H01L 21/76843 257/E21.584 |
| 7,323,731 | B2 | * | 1/2008 | Yuzurihara | H01L 27/14603 257/233 |
| 7,420,231 | B2 | * | 9/2008 | Maruyama | H01L 27/14623 257/233 |
| 8,427,568 | B2 | * | 4/2013 | Takeda | H01L 27/14685 257/215 |
| 2004/0253807 | A1 | * | 12/2004 | Thei | H01L 21/76846 438/627 |
| 2008/0169570 | A1 | * | 7/2008 | Saito | H01L 21/2855 257/774 |

FOREIGN PATENT DOCUMENTS

JP     2010-153884 A     7/2010

\* cited by examiner

*Primary Examiner* — Michael Lebentritt
(74) *Attorney, Agent, or Firm* — Canon U.S.A., Inc. IP Division

(57) ABSTRACT

A method of manufacturing a semiconductor device provided with an interlayer insulating film formed on a semiconductor substrate, and a plurality of wiring layers formed on the interlayer insulating film. The method includes forming of a first wiring layer closest to the semiconductor substrate among the plurality of wiring layers, and forming of an alloy of a titanium layer and a metal layer by heating treatment. The forming of the first wiring layer includes: forming of a titanium layer on an interlayer insulating film; forming of a metal layer containing a metal capable of forming an alloy with titanium in the titanium layer; forming of an orientation layer on the metal layer; and forming of an aluminum layer on the orientation layer.

12 Claims, 4 Drawing Sheets

METHOD OF MANUFACTURING SEMICONDUCTOR DEVICE AND SEMICONDUCTOR DEVICE

BACKGROUND

1. Field of the Invention

The present disclosure relates to a method of manufacturing a semiconductor device and the semiconductor device.

2. Description of the Related Art

Various types of metal wiring are disposed on a semiconductor substrate for transferring a signal and controlling operation of a device. The wiring is formed in an interlayer insulating film formed on the semiconductor substrate, and aluminum is widely used as a main material thereof.

Then, in order to improve an electromigration resistance (hereinafter, also referred to as EM) feature in a case where the aluminum is used, there is used the wiring in which titanium, titanium nitride, and aluminum are laminated from lower to upper layers in order.

By the way, in manufacturing of the semiconductor device, hydrogen processing (sintering) is performed, for example, to terminate a dangling bond in a semiconductor layer.

In Japanese Patent Application Laid-Open No. 2010-153884 (hereinafter, referred to as Patent Literature 1), there is disclosed a technique of suppressing titanium from adsorbing hydrogen during the sintering in a structure having the above-described wiring. Specifically, by forming an underlay layer below a layer of titanium in the above-described wiring structure of titanium/titanium nitride/aluminum, transmission of the hydrogen into a titanium film is suppressed, and an amount of the hydrogen being adsorbed on the titanium is decreased.

In the method described in Patent Literature 1, silicon nitride and titanium nitride are used as the underlay layer for preventing the transmission of the hydrogen on the titanium film. Between such films and silicon oxide, which is generally used as an interlayer insulating film, an interface stress is relatively large, whereby there is a possibility that the underlay layer may peel off from the interlayer insulating film in a process of forming the wiring.

SUMMARY

One embodiment of the present disclosure has been devised to solve the above-described problem, and an objective thereof is to enable decreasing an amount of hydrogen being adsorbed on titanium in wiring during sintering as well as to make stress on an interface between wiring and an interlayer insulating film small.

One embodiment of the present disclosure may be summarized as follows: a metal layer capable of forming an alloy with the titanium is formed on the titanium disposed on the interlayer insulating film, and then, the titanium is alloyed.

One aspect of the present disclosure is a method of manufacturing a semiconductor device provided with a first interlayer insulating film disposed on a semiconductor substrate and a plurality of wiring layers formed on the first interlayer insulating film, the method includes: forming of a first wiring layer closest to the semiconductor substrate among the plurality of wiring layers; and forming of an alloy of titanium in a first titanium layer and a first metal in a first metal layer by heating treatment. The forming of the first wiring layer includes forming of the first titanium layer on the first inter-layer insulating film, forming, on the first titanium layer, of the first metal layer containing the first metal capable of forming an alloy with the titanium in the first titanium layer, forming of a first orientation layer on the first metal layer, and forming of a first aluminum layer on the first orientation layer.

A second aspect of the present disclosure is a semiconductor device provided with a first interlayer insulating film formed on a semiconductor substrate, and a plurality of wiring layers formed on the first interlayer insulating film. A first wiring layer, which is closest to the semiconductor substrate among the plurality of wiring layers, is provided with: a first titanium alloy layer disposed on the first interlayer insulating film; a first orientation layer disposed on the first titanium alloy layer; and a first aluminum layer disposed on the first orientation layer.

Further features of the present invention will become apparent from the following description of exemplary embodiments (with reference to the attached drawings).

DESCRIPTION OF THE EMBODIMENTS

First Embodiment

Figure 1:
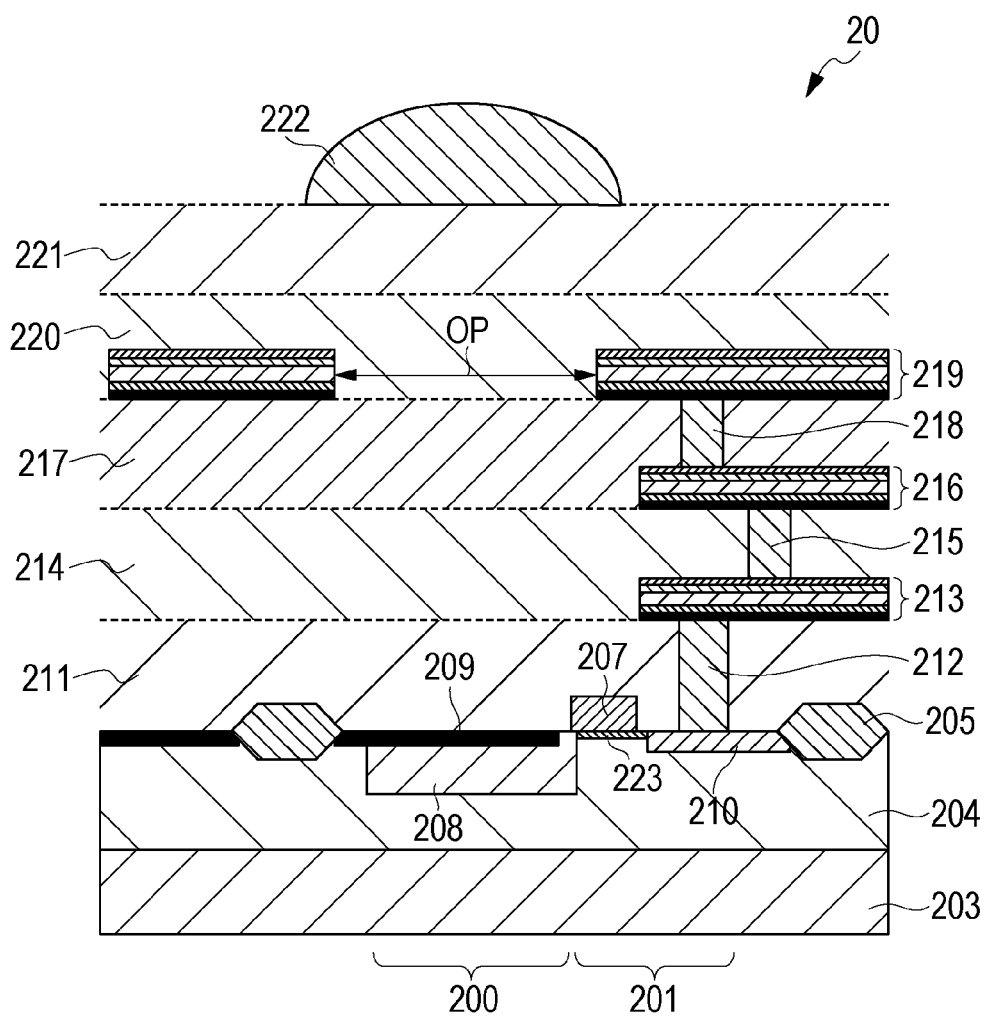
FIG. 1 is a view illustrating an image pickup device according to a first embodiment.

A first embodiment described herein is described by using FIG. 1. FIG. 1 is a semiconductor device in which wiring according to one embodiment of the present disclosure is used. In a description, an image pickup device is used as one example of the semiconductor device. FIG. 1 is a view schematically illustrating a section of the image pickup device. Note that a well-known or publicly known technique in the particular art is to be applied to a part not illustrated or described herein. Embodiments described hereinafter are exemplary embodiments of the present disclosure, and embodiments are not to be limited to these. The embodiment below is described by taking an example of a case where an electron is used as a signal carrier. In a case where a hole is used as the signal carrier, all of conductivity types may be reversed for each semiconductor area and an impurity region.

In FIG. 1, an image pickup device is described by taking a CMOS area sensor as an example. The CMOS area sensor is a sensor that forms an image pickup region and a peripheral circuit region in substantially the same process (CMOS process). The CMOS area sensor 20 is provided with: a photo diode unit (hereinafter, also referred to as a PD unit) 200 formed on a substrate 203 formed of an N-type silicon; and a transfer MOS transistor 201 that transfers an electric signal from the PD unit 200. Furthermore, the CMOS area sensor 20 has wiring for giving bias for driving a MOS transistor such as the transfer MOS transistor 201, wiring for transferring a signal generated in photoelectric conversion to a signal processing circuit therearound, and wiring for shielding light. In a case where an amplification function is provided to a pixel, it has an amplifying MOS transistor besides the transfer MOS transistor. Furthermore, it has a resetting MOS transistor, a pixel selecting MOS transistor, and the like as necessary. On the substrate 203, a P-type well 204 is formed. In the P-type well 204, an N-type electric carrier accumulation region 208 is formed, and a surface P-type area 209 for making the PD an embedded structure is formed thereon. Through a gate electrode 207 of the transfer MOS transistor, a drain region 210 of the transfer MOS transistor 201 is formed on an opposite side of the N-type electric carrier accumulation region 208. The drain region 210, which is an N-type impurity region, also functions as a floating diffusion region, which converts a transferred electric carrier into voltage.

The PD unit 200 and the transfer MOS transistor 201 are covered with an interlayer insulating film 211 containing silicon oxide, and a first wiring layer 213 is provided thereon. Wiring not connected with a gate electrode in the first wiring layer 213 is insulated from the gate electrode 207 by the interlayer insulating film 211. The first wiring layer 213 includes wiring, which is connected to the drain region 210 by a contact plug 212 penetrating the interlayer insulating film 211.

Similarly, the first wiring layer 213 is covered with an interlayer insulating film 214, and a second wiring layer 216 is formed thereon. The second wiring layer 216 is connected to the first wiring layer 213 at a predetermined position by a via plug 215, which penetrates the interlayer insulating film 214. Similarly, the second wiring layer 216 is covered with an interlayer insulating film 217, and a third wiring layer 219 is formed thereon. The third wiring layer 219 is connected to the second wiring layer 216 at a predetermined position by a via plug 218, which penetrates the interlayer insulating film 217. The contact plug 212 and the via plugs 215 and 218 are configured to contain tungsten.

The third wiring layer 219 is covered with a passivation film 220, which is configured to contain a silicon nitride film. Between the passivation film 220 and an interlayer insulating film containing a silicon oxide film, it is also possible to form a silicon oxynitride film having an index of refraction between an index of refraction of the passivation film 220 and that of an interlayer insulating film. By this silicon oxynitride film, reflection of light is suppressed on an interface between the passivation film 220 and the interlayer insulating film 217 containing the silicon oxide film. Accordingly, it is possible to suppress color unevenness, which is caused when the reflected light enters the adjacent PD unit 200. On an upper layer of the passivation film 220, there is formed a color filter layer 221 and a micro lens layer 222 for improving sensitivity. In the color filter layer 221, three primary colors of red, green, and blue are formed respectively corresponding to each of the PD units 200.

The light, which has entered from a surface of the CMOS area sensor 20, passes through the color filter layer 221, is selectively dispersed into a wavelength indicating sensitivity of each color, and reaches the PD unit 200 through an opening region OP where no wiring layer exists. The light that has reached is absorbed inside the N-type electric carrier accumulation region 208 or inside the P-type well 204 of the PD unit 200, and generates an electron-hole pair. The electron thereof is accumulated in the N-type electric carrier accumulation region 208. The electron accumulated in the N-type electric carrier accumulation region 208 is sent to the drain region 210 by an on/off operation of the gate electrode 207, and is read through a wiring structure constituted of the contact plug 212, the first wiring layer 213, and the like. In a case where an amplifying element is provided to the pixel, it is connected to a gate of an amplifying MOS transistor through the first wiring layer 213. After being converted into voltage by an input node of the amplifying MOS transistor, it is transferred to the signal processing circuit through desired wiring.

Figure 2:
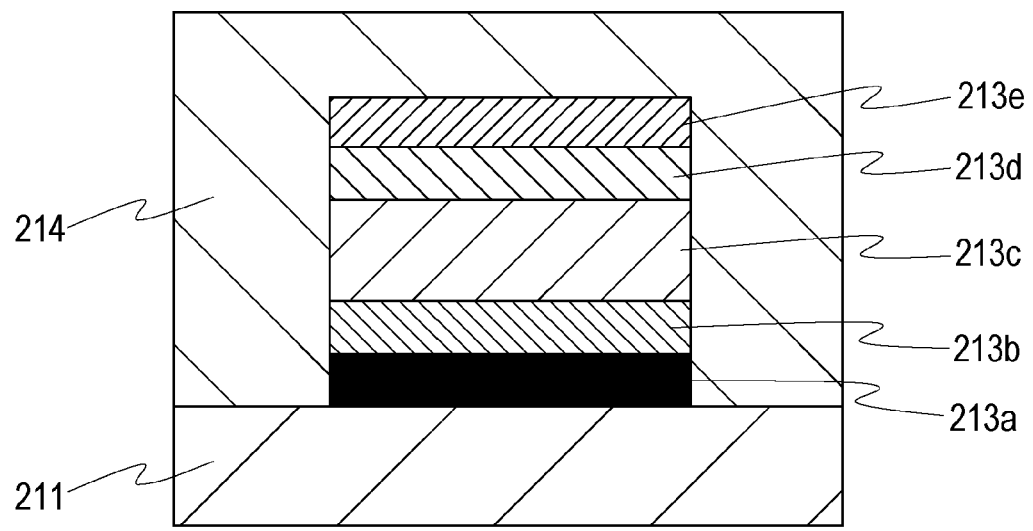
FIG. 2 is a view illustrating a detailed structure of wiring according to the first embodiment.

Here, a detailed structure of wiring, which is a characteristic of this embodiment, is described by using FIG. 2. FIG. 2 is an enlarged view illustrating the image pickup device illustrated in FIG. 1 centering on a part of the first wiring layer 213.

The first wiring layer 213 is disposed on the interlayer insulating film 211. In a state before a titanium alloy is formed in a titanium layer 213a described below, from lower to upper layers in order, it includes five layers of the titanium layer 213a, a metal layer 213b, an orientation layer 213c, an aluminum layer 213d, and a barrier layer 213e.

The titanium layer 213a has a small interface stress with the silicon oxide, which is generally used as the interlayer insulating film 211, than an interface stress between the silicon oxide and titanium nitride or silicon nitride. Therefore, by the titanium layer 213a being formed on the interlayer insulating film 211, it is possible to decrease a possibility of causing film peeling off during film-forming of the titanium layer 213a. The titanium layer 213a is desirably formed to have a (002) orientation so as to increase a crystal orientation property of the metal layer 213b to be laminated thereon. The titanium layer 213a may also include another metal element and non-metal element as long as there is not much influence on the interface stress with the interlayer insulating film 211.

The metal layer 213b is constituted of a metal capable of forming an alloy with the titanium layer 213a in a lower layer by heating treatment. As a metal that constitutes the metal layer 213b, for example, aluminum may be used. In order to increase an orientation property of the orientation layer 213c laminated on the metal layer 213b, it is preferred that the metal layer 213b be oriented and grown by using crystal orientation of the titanium layer 213a as an undercoat. In a case where the aluminum is used in the metal layer 213b, by the aluminum being formed so as to have a (111) orientation, it is possible to obtain a good quality crystal film having a small lattice mismatch with titanium having the (002) orientation in the titanium layer 213a.

A specific aspect of an alloy of the titanium in the titanium layer 213a and a metal in the metal layer 213b may take a variety of aspects such as a eutectic, a solid solution, and an intermetallic compound. It is most preferable that the intermetallic compound be formed from a point of decreasing an amount of adsorption of hydrogen by the titanium.

It is preferred that a film thickness, when the metal layer 213b is formed, be set such that all of the titanium in the titanium layer 213a can be alloyed when an alloy is formed with the titanium layer 213a in a lower layer. For example, in a case where aluminum is used as the metal layer 213b and an intermetallic compound of titanium and aluminum is formed, it is possible to cause the titanium in the titanium layer 213a to sufficiently react by setting the film thickness of the metal layer 213b to be three or more times that of a film thickness of the titanium layer 213a. This is caused because a chemical theoretical mixture ratio of the intermetallic compound of the titanium and the aluminum is changeable between 1:3 and 3:1. That is, when the film thickness of the metal layer 213b is three or more times that of the film thickness of the titanium layer 213a, even when all of the intermetallic compounds to be formed are $TiAl_3$, it is possible to alloy all of the titanium in the titanium layer 213a. Once a titanium alloy layer is formed, an aluminum layer that is not alloyed may remain on the titanium alloy layer. Other than aluminum, nickel, for example, may be a material capable of forming an alloy with the titanium.

As a condition of the heating treatment, by heating up to 350 degrees or above of a substrate temperature, metal diffusion in the metal layer 213b is prompted, whereby it is possible to further facilitate formation of the alloy with the titanium. On the other hand, in order to prevent orientation property in other layers of the wiring layer from being deteriorated due to the heating treatment, it is preferred that the substrate temperature be 500 degrees or below during the heating treatment. That is, it is preferred that the substrate temperature be set within a range of 350 degrees or above and 500 degrees or below during the heating treatment. As for a time of heating treatment, it is preferred that it be set within a range of 30 seconds to 60 minutes according to the film thickness of the titanium layer 213a. Another metal element and non-metal element may be included in the metal layer 213b as long as it does not excessively obstruct alloying with the titanium layer 213a. As a material of the metal layer 213b, aluminum to which copper of 0.5 weight % may be added.

The orientation layer 213c is used with an objective of increasing crystal orientation property of the aluminum layer 213d laminated thereon. As a material of the orientation layer 213c, for example, titanium nitride may be used. A lattice interval of a titanium nitride layer having the (111) orientation approximates a lattice interval of aluminum having the (111) orientation. Therefore, by using the titanium nitride having the (111) orientation as the orientation layer 213c, it is possible to improve the (111) orientation of the aluminum layer 213d, which is laminated on the orientation layer. Furthermore, in a case where the aluminum having the (111) orientation is used as the metal layer 213b, it is possible to further improve the (111) orientation of the titanium nitride. Therefore, it is possible to further increase the orientation of the orientation layer 213c, and further improve the (111) orientation of the aluminum layer 213d formed on the orientation layer 213c. The orientation layer 213c may contain other metal element and non-metal element as long as it does not excessively deteriorate crystallinity thereof.

In order to increase resistance against EM, it is preferred that the aluminum layer 213d have the (111) orientation. In this embodiment, as a material of the aluminum layer 213d, aluminum to which 0.5 wt. % copper is added may be used. The aluminum layer 213d may contain other metal element and non-metal element as long as it does not excessively deteriorate conductivity and the resistance against EM thereof.

The barrier layer 213e is formed for suppressing the aluminum in the aluminum layer 213d, formed in a lower layer, from being diffused into the interlayer insulating film. As a material of the barrier layer 213e, for example, titanium nitride is used. The barrier layer 213e is not an essential component of this embodiment, but it is preferred to provide it for reliability and prolonged life of the wiring.

By performing the above-described heating treatment to the wiring layer having laminated films, the titanium in the titanium layer 213a and a material in the metal layer 213b form an alloy. The titanium in the alloy formed by the heating treatment has a small amount of adsorption of the hydrogen relative to the titanium in the titanium layer 213a before the alloy is formed. Therefore, in sintering performed after the heating treatment, adsorption of the hydrogen on the titanium is suppressed.

Hereinafter, the crystal orientation property of each film of the titanium layer 213a, the metal layer 213b, the orientation layer 213c, and the aluminum layer 213d is described more in detail. These layers are manufactured preferably by using a sputtering method in order to improve the orientation property. As described above, in a case where the aluminum is used in the metal layer 213b and the titanium nitride is used in the orientation layer, it is preferred that the titanium layer 213a have the (002) orientation and the metal layer 213b, the orientation layer 213c, and the aluminum layer 213d have the (111) orientation. In general, when the substrate temperature is low during the sputtering, movement of an atom is small, whereby it is known that a film-formed coating film has the crystal orientation such that a densest surface thereof becomes parallel to the substrate. Since a (002) surface is the densest in the titanium and a (111) surface is the densest in the titanium nitride, it is preferred that these films be manufactured at a low temperature.

Here, a film-forming condition for each layer is described in detail.

In the titanium layer 213a, when the substrate temperature during film forming exceeds 300 degrees, the (002) orientation becomes weak, and the (011) orientation becomes strong. Therefore, it is preferred that the substrate temperature be set to 300 degrees or lower during the film forming. On the other hand, when the substrate temperature becomes lower than 50 degrees, crystallinity of the film is decreased. This is considered to be because sufficient energy is not given to sputtered titanium particles due to a low substrate temperature, whereby the titanium particles do not bond with each other on the substrate. Accordingly, with regard to the titanium layer 213a, it is preferred that the substrate temperature be set in a range of 50 degrees or above and 300 degrees or below during the film forming by using the sputtering method. In order to improve the orientation property, it is preferred that the film forming be performed at a film forming rate of 1 nm/s or above and 5 nm/s or below. For the titanium nitride in the orientation layer 213c as well, in order to obtain a titanium nitride film having the (111) orientation, it is preferred that the substrate temperature be set to 300 degrees or below during the film forming. Same as the titanium, the film crystallinity decreases when the substrate temperature becomes lower than 50 degrees, whereby it is preferred that the film forming be performed at 50 degrees or above. In order to improve the orientation, it is preferred that the film forming be performed such that the film forming rate become 1 nm/s or above and 5 nm/s or below by using a reactive sputtering method using a titanium target and nitrogen gas.

With regard to the aluminum in the metal layer 213b and the aluminum layer 213d as well, it is possible to obtain a film having the (111) orientation by using the sputtering method by setting the substrate temperature to 50 degrees or above and 300 degrees or below. In order to improve the orientation property, it is preferred that the film forming be performed such that the film forming rate is 5 nm/s or above and 20 nm/s or below.

As for a temperature control of the above-described substrate, various methods may be adopted such as heating by a heater provided within a substrate holder and by contacting a heated gas on a back surface of the substrate by using electrostatic adsorption. Furthermore, with regard to the sputtering method, any of DC and RF methods may be used, and a magnetron sputtering method is preferred from a viewpoint of increasing the orientation property.

In the image pickup device, in particular, terminating of a dangling bond of Si on a surface of the substrate 203 such as an N-type electric carrier accumulation region 208, which functions as a part of the PD unit 200, and a channel region 223, through which a carrier passes, becomes important. A dark current may be effectively suppressed by terminating the dangling bond of the Si on the surface of these regions.

In this embodiment, it becomes possible to suppress the adsorption of hydrogen on the titanium contained in each of the wiring layers when the sintering is performed and to effectively terminate the dangling bond of the Si on the surface of the substrate 203. Since the titanium layer is formed on the interlayer insulating film so as to contact the interlayer insulating film during forming of the wiring layer, the interface stress between the interlayer insulating film and the wiring layer during the titanium layer forming is small compared to when forming the titanium nitride and the silicon nitride on the interlayer insulating film. Furthermore, by orientation growing the titanium, the orientation property of the metal layer, the orientation layer, and the aluminum layer formed on the titanium layer is increased, whereby it is possible to increase the resistance against the EM.

Here, the first wiring layer 213 disposed at a position closest to the substrate 203 may influence an amount of hydrogen supplied to each point of the substrate 203 because it is close to the substrate 203. Specifically, the amount of hydrogen supplied to each point of the substrate 203 is influenced by a wiring pattern of the first wiring layer 213, and variation may be caused to the amount of hydrogen supplied to each point within a surface of the substrate 203. To this, by applying the configuration according to this embodiment to the first wiring layer 213 disposed to the closest position relative to the substrate 203, it is possible to decrease the variation in the amount of hydrogen supplied to each point within the surface of the substrate 203 due to the above-described wiring pattern. Therefore, the wiring structure according to this embodiment is used at least for the first wiring layer 213. With regard to other wiring layers, in particular, a wiring layer that divides an opening region relative to light that enters the PD unit 200 has a larger area than the other wiring layers when it is viewed from a top face of the substrate 203. Therefore, among a plurality of wiring layers, it may be effective to apply this embodiment to the wiring layer that divides the opening region in addition to the wiring layer closest to the substrate 203 from a viewpoint of decreasing adsorption of the hydrogen by the wiring layer. One example of the wiring layer that divides the opening region is a third wiring layer 219.

Note that in this embodiment, the third wiring layer 219 is covered with a passivation film 220 formed of silicon nitride. The silicon nitride formed by a plasma excitation CVD (hereinafter, also referred to as PECVD) method contains much hydrogen within a film thereof, whereby sintering is performed by heating the substrate on which the silicon nitride film is formed. By the heating of the substrate, the hydrogen within the silicon nitride film is diffused, whereby terminating of the dangling bond of the Si on the surface of the substrate 203 is performed.

Next, a method of manufacturing the image pickup device according to this embodiment is described by using FIGS. 3A to 3G.

Figure 3A:
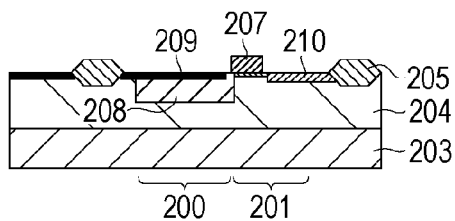
FIGS. 3A to 3G are views illustrating a method of manufacturing the image pickup device according to the first embodiment.

First, there is prepared the N-type silicon substrate 203 on which the P-type well 204, the drain region 210, the N type electric carrier accumulation region 208, the surface P-type area 209, a field oxide film 205, an unillustrated gate insulating film, and the gate electrode 207 are disposed (FIG. 3A).

Figure 3B:
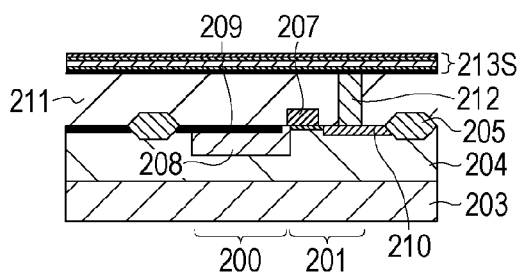

Next, silicon oxide is deposited in the PECVD method so as to cover the substrate 203, and the interlayer insulating film 211 is formed by performing planarization by a CMP method. Subsequently, a trench is formed by using a photolithography method, and the contact plug 212 is formed by filling a metal in the trench. The contact plug 212 may be configured to contain a barrier metal. An excessive metal film is removed by the CMP method. Then, layers 213a to 213e described in FIG. 2 are laminated by the magnetron sputtering method to form a laminated film 213S (FIG. 3B). The titanium layer 213a is film formed by using the titanium target under a condition of a target voltage of 3 kW, a substrate temperature of 250 degrees, and a film forming rate of 2 nm/s. Both of the metal layer 213b and the aluminum layer 213d are film formed by using an AlCu target under a condition of a target voltage of 22 kW, a substrate temperature of 300 degrees, and a film forming rate of 15 nm/s. The orientation layer 213c is formed by using the titanium target by the reactive sputtering method in which nitrogen gas is flowed into a discharge space during sputtering. The orientation layer 213c is film formed under a condition of a target voltage of 13 kW, a substrate temperature of 250 degrees, and a film forming rate of 2 nm/s. As one example of a detailed structure of the laminated film 213S is, from lower to upper layers in order, the titanium layer is 100 Å, AlCu containing 0.5 wt. % of copper is 300 Å, TiN is 200 Å, AlCu containing 0.5 wt. % of copper is 3000 Å, and TiN is 300 Å.

Figure 3C:
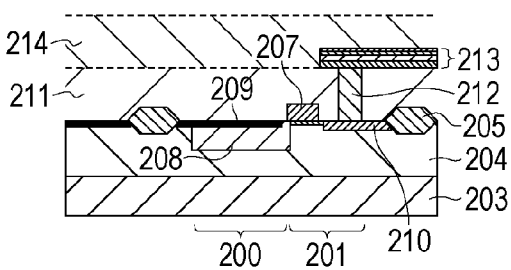

Subsequently, the heating treatment is performed after the laminated film 213S is patterned by using the photolithography method, whereby the first wiring layer 213 is formed. By performing the heating treatment, the titanium in the wiring layer and the metal layer form an alloy. The heating treatment is performed, for example, for 30 minutes at 400 degrees. Subsequently, the interlayer insulating film 214 is formed on the interlayer insulating film 211 and the wiring layer 213. (FIG. 3C).

Figure 3D:
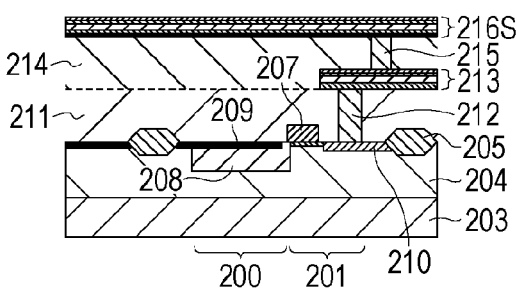

Next, a trench is formed in the interlayer insulating film 214, and the via plug 215 is formed in the same way as the contact plug 212, and an excessive metal film is removed. Then, a laminated film 216S having a structure described in FIG. 2 is formed on the interlayer insulating film 214 (FIG. 3D).

Figure 3E:
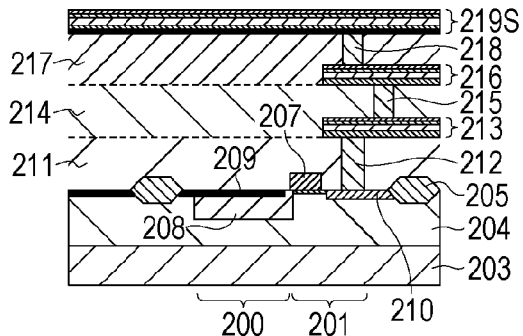

Subsequently, the heating treatment is performed after the laminated film 216S is patterned to form a second wiring layer 216. Then, the interlayer insulating film 217, the via plug 218, and a laminated film 219S according to this embodiment are formed (FIG. 3E). The via plug 218 may be configured to contain a barrier metal.

Figure 3F:
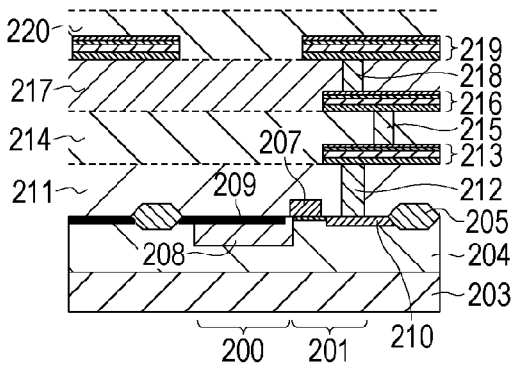
Figure 3G:
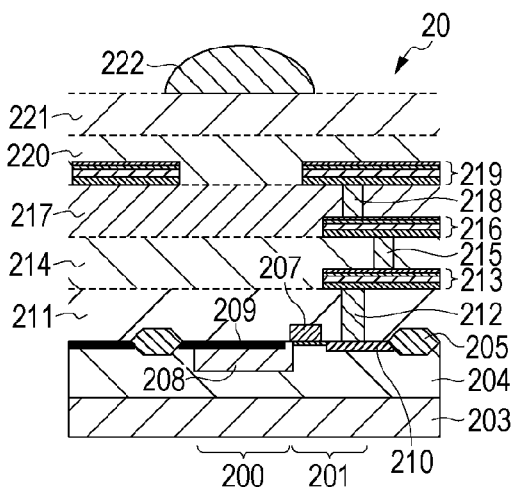

Then, the heating treatment is performed after the laminated film 219S is patterned to form the wiring layer 219. Subsequently, on the interlayer insulating film 217 and the third wiring layer 219, the passivation film 220 is formed by the PECVD method, and sintering is performed (FIG. 3F). In a case of this embodiment, by using the PECVD method using silane ($SiH_4$) and oxygen when film forming the interlayer insulating films 211, 214, and 217, the interlayer insulating films that have been formed contain hydrogen therein. Also, by using the PECVD method using the $SiH_4$ and ammonia ($NH_3$) when forming the passivation film, the passivation film 220 that has been formed contains hydrogen therein. By performing the heating treatment for 30 minutes at 400 degrees, for example, on the substrate on which a film containing the hydrogen is formed, the hydrogen within the film is diffused, whereby it is possible to perform the terminating of the dangling bond on the surface of the substrate 203.

Next, the color filter layer 221 and the micro lens layer 222 are formed on the passivation film 220, whereby an image pickup device 20 can be obtained.

It is preferred that the heating treatment for alloying the titanium in a titanium layer in each of the laminated films 213S, 216S, and 219S with the metal in the metal layer be performed after each of the laminated films is formed and before each of the interlayer insulating films is formed in each of the patterned laminated films. In addition to alloying of the titanium in the titanium layer with the metal in the metal layer, a lattice defect and the lattice mismatch within the aluminum layer are improved by performing the heating treatment after the laminated films are formed, whereby it is possible to decease a damage caused to the aluminum layer when the interlayer insulating film and the like are formed subsequently. By performing the heating treatment in a state where each of the laminated films is positioned in an uppermost surface of the substrate before the interlayer insulating film is formed, each of the laminated films is sufficiently heated and the alloying of the titanium is facilitated.

As a method of sintering, in this embodiment, a film containing hydrogen is formed on the semiconductor substrate, and the hydrogen is supplied to the surface of the substrate by heating the film. Various other methods may be adopted such as a method of exposing the substrate to a hydrogen atmosphere, a method of exposing the substrate to hydrogen plasma, and a method of performing heating together with these methods.

Second Embodiment

Figure 4:
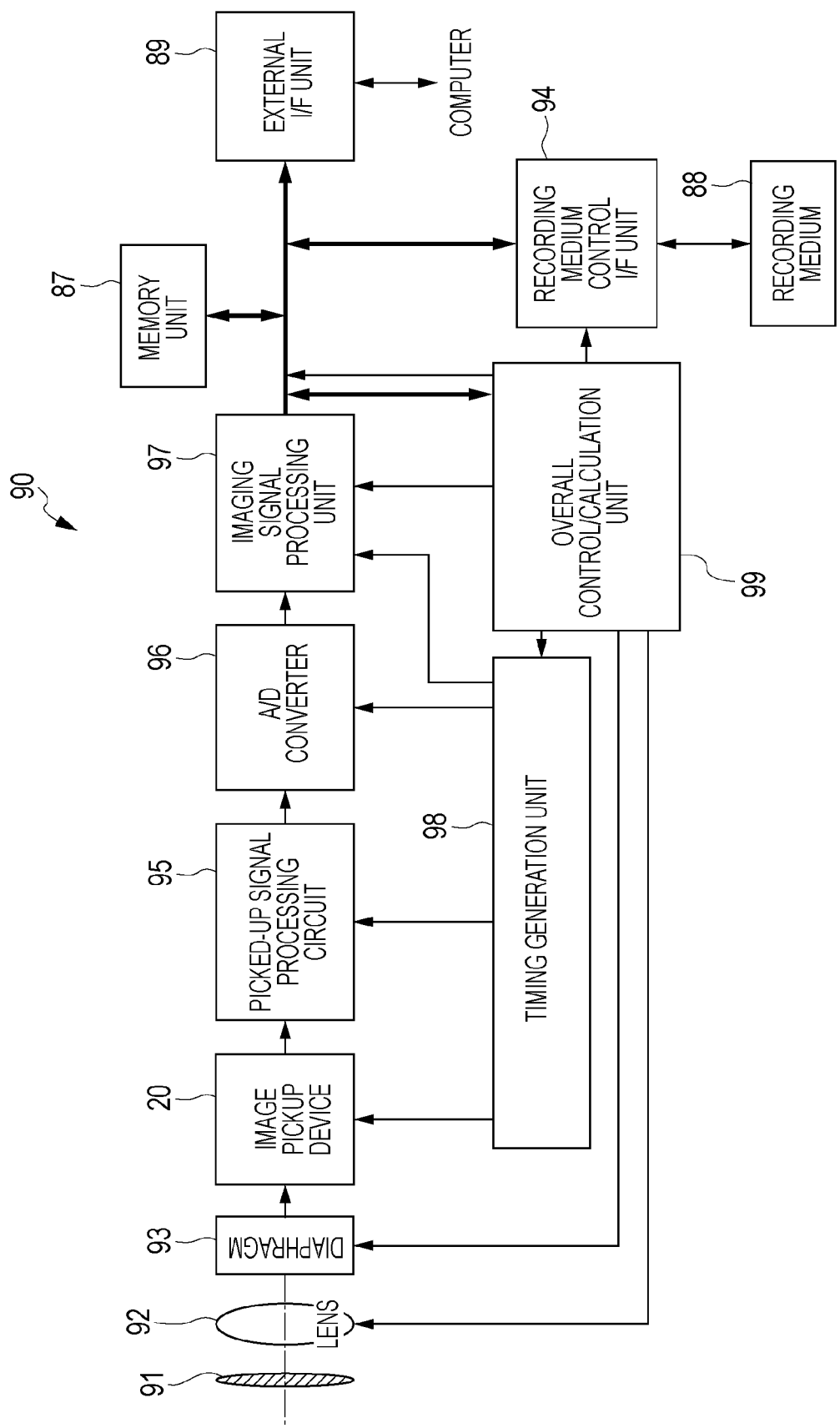
FIG. 4 is a view illustrating an image pickup system according to a second embodiment.

Next, one example of an image pickup system using an image pickup device is illustrated in FIG. 4. An image pickup system 90, as illustrated in FIG. 4, is provided mainly with an optical system, the image pickup device 20 described in the first embodiment, and a signal processing unit. The optical system is mainly provided with a shutter 91, a lens 92, and a diaphragm 93. The signal processing unit is mainly provided with a picked-up signal processing circuit 95, an A/D converter 96, an imaging signal processing unit 97, a memory unit 87, an external I/F unit 89, a timing generation unit 98, an overall control/calculation unit 99, a recording medium 88, and a recording medium control I/F unit 94. Note that the signal processing unit may not be provided with the recording medium 88. The shutter 91 is provided before the lens 92 on an optical path and controls exposure. The lens 92 refracts light that has entered and forms an image of a subject on an image pickup surface of a PD unit of the image pickup device 20. The diaphragm 93 is provided between the lens 92 and the PD unit on the optical path, and adjusts an amount of light to be led to the PD unit after passing through the lens 92. The PD unit of the image pickup device 20 converts the image of the subject formed on the image pickup surface into an imaging signal. The image pickup device 20 reads the imaging signal from the PD unit and outputs it. The picked-up signal processing circuit 95 is connected to the image pickup device 20 and processes the imaging signal that has been output from the image pickup device 20. The A/D converter 96 is connected to the picked-up signal processing circuit and converts the processed imaging signal (analog signal) that has been output from the picked-up signal processing circuit 95 into an imaging signal (digital signal). The imaging signal processing unit 97 is connected to the A/D converter 96. It performs various arithmetic processing such as correction on the imaging signal (digital signal) that has been output from the A/D converter 96, and generates image data. This image data is supplied to the memory unit 87, the external I/F unit 89, the overall control/calculation unit 99, the recording medium control I/F unit 94, and the like. The memory unit 87 is connected to the imaging signal processing unit 97 and stores the image data that has been output from the imaging signal processing unit 97. The external I/F unit 89 is connected to the imaging signal processing unit 97. Accordingly, the image data that has been output from the imaging signal processing unit 97 is transferred to an external device (e.g. PC) through the external I/F unit 89. The timing generation unit 98 is connected to the image pickup device 20, the picked-up signal processing circuit 95, the A/D converter 96, and the imaging signal processing unit 97. Accordingly, a timing signal is supplied to the image pickup device 20, the picked-up signal processing circuit 95, the A/D converter 96, and the imaging signal processing unit 97. Then, the image pickup device 20, the picked-up signal processing circuit 95, the A/D converter 96, and the imaging signal processing unit 97 operate in synchronization with the timing signal. The overall control/calculation unit 99 is connected to the timing generation unit 98, the imaging signal processing unit 97, and the recording medium control I/F unit 94, and it performs overall control of the timing generation unit 98, the imaging signal processing unit 97, and the recording medium control I/F unit 94. The recording medium 88 is detachably connected to the recording medium control I/F unit 94. Accordingly, the image data that has been output from the imaging signal processing unit 97 is recorded in the recording medium 88 through the recording medium control I/F unit 94.

Note that the above-described image pickup device has been used as an example of a semiconductor device using wiring according to the present invention; however, the wiring according to the present invention is also applicable to various sensors using photoelectric conversion such as a photometry sensor and a ranging sensor as well as another semiconductor device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-176253, filed Aug. 28, 2013, which is hereby incorporated by reference herein in its entirety.

What is claimed is:

1. A method of manufacturing a semiconductor device provided with a plurality of wiring layers disposed on a first interlayer insulating film, the method comprising:
    forming the first interlayer insulating film disposed on a semiconductor substrate;
    forming a first titanium layer on the first interlayer insulating film;
    forming, on the first titanium layer, a first metal layer containing a first metal capable of forming an alloy with titanium in the first titanium layer;
    forming a first orientation layer on the first metal layer;
    forming a first aluminum layer on the first orientation layer;
    patterning a laminated layer including the first titanium layer, the first metal layer, the first orientation layer, and the first aluminum layer so as to form a first wiring layer;
    forming a second interlayer insulating film on the first wiring layer after the patterning the laminated layer;
    forming an alloy of the titanium in the first titanium layer and the first metal in the first metal layer by heating treatment; and
    forming a trench in the second interlayer insulating film, wherein
the first wiring layer is closest to the semiconductor substrate among the plurality of wiring layers.

2. The method of manufacturing the semiconductor device according to claim 1, wherein the first metal is aluminum, and the first orientation layer is a titanium nitride layer.

3. The method of manufacturing the semiconductor device according to claim 1, wherein a film thickness of the first metal layer is three or more times of a film thickness of the first titanium layer.

4. The method of manufacturing the semiconductor device according to claim 1, wherein the first orientation layer and the first aluminum layer have a orientation.

5. The method of manufacturing the semiconductor device according to claim 1, wherein sintering is performed after the patterning the laminated layer.

6. The method of manufacturing the semiconductor device according to claim 1, wherein the heating treatment in the forming of the alloy of the titanium in the first titanium layer and the first metal in the first metal layer is performed in a range of 350 degrees or above and 500 degrees or below.

7. The method of manufacturing the semiconductor device according to claim 1, wherein
the first titanium layer, the first metal layer, the first orientation layer, and the first aluminum layer are film formed by a sputtering method,
a film forming rate of the first titanium layer is 1 nm/s or above and 5 nm/s or below,
a film forming rate of the first orientation layer is 1 nm/s or above and 5 nm/s or below, and
film forming rates of the first metal layer and the first aluminum layer are 5 nm/s or above and 20 nm/s or below.

8. The method of manufacturing the semiconductor device according to claim 1, further comprising:
forming, among the plurality of wiring layers, a second wiring layer adjacent to the first wiring layer through the second interlayer insulating film, wherein
the forming of the alloy of the titanium in the first titanium layer and the first metal in the first metal layer is performed after the forming of the first wiring layer and before the forming of the second wiring layer.

9. The method of manufacturing the semiconductor device according to claim 1, the semiconductor device further provided with
a photo diode unit formed on the semiconductor substrate,
a third wiring layer configured to divide an opening region relative to the photo diode unit among the plurality of wiring layers,
the method of manufacturing the semiconductor device further comprising:
forming the third wiring layer, wherein
the forming the third wiring layer includes
    forming of a second titanium layer,
    forming, on the second titanium layer, a second metal layer containing a second metal capable of forming an alloy with titanium in the second titanium layer,
    forming a second orientation layer on the second metal layer, and
    forming a second aluminum layer on the second orientation layer; and
forming an alloy of the titanium in the second titanium layer and the second metal in the second metal layer by heating treatment.

10. The method of manufacturing the semiconductor device according to claim 9, wherein the forming of the alloy of the titanium in the first titanium layer and the first metal in the first metal layer is performed after the patterning the laminated layer and before the forming of the third wiring layer.

11. The method of manufacturing the semiconductor device according to claim 9, further comprising:
forming a passivation film on the third wiring layer; and
performing sintering after the passivation film has been formed.

12. The method of manufacturing the semiconductor device according to claim 11, wherein the sintering is performed by exposing the semiconductor substrate to a hydrogen atmosphere.

* * * * *